March 20, 1973 R. G. HAYS 3,721,588
THIN SINGLE CRYSTAL SILICON ON AN INSULATING SUBSTRATE
AND IMPROVED DIELECTRIC ISOLATION PROCESSING METHOD
Filed Aug. 13, 1971 2 Sheets-Sheet 1

INVENTOR.
Robert G. Hays
Chongkook Rhee
BY
Mueller & Aichele
ATTY'S.

March 20, 1973 R. G. HAYS 3,721,588
THIN SINGLE CRYSTAL SILICON ON AN INSULATING SUBSTRATE
AND IMPROVED DIELECTRIC ISOLATION PROCESSING METHOD
Filed Aug. 13, 1971 2 Sheets-Sheet 2

INVENTOR
Robert G. Hays
BY Chongkook Rhee
Mueller & Aichele
ATTY'S.

United States Patent Office 3,721,588
Patented Mar. 20, 1973

3,721,588
THIN SINGLE CRYSTAL SILICON ON AN INSULATING SUBSTRATE AND IMPROVED DIELECTRIC ISOLATION PROCESSING METHOD

Robert G. Hays and Chongkook Rhee, Scottsdale, Ariz., assignors to Motorola, Inc., Franklin Park, Ill.
Filed Aug. 13, 1971, Ser. No. 171,453
Int. Cl. H01l 7/50, 7/00; B01j 17/00
U.S. Cl. 148—175 13 Claims

ABSTRACT OF THE DISCLOSURE

A method is disclosed whereby by incorporating a P+ boron layer of $5\times10^{19}$ atoms per cubic centimeter or greater added during the fabrication of a wafer acts as an etch stop for a potassium hydroxide anisotropic etch solution (KOH). Thereby thin controlled layers of single crystal silicon on an insulating substrate can be made. Similarly using the same etch stop dielectrically isolated islands of single crystal silicon may be formed with improved yields and thickness control.

RELATED APPLICATIONS

This application is related to the application entitled "Etch Stop for KOH Anisotropic Etch," Ser. No. 171,455, filed Aug. 13, 1971, and assigned to the same assignee as the subject invention.

BACKGROUND OF THE INVENTION

Heretofore, it has been believed that the etching of silicon and boron doped silicon in particular by the anisotropic etchant, potassium hydroxide solution, proceeded at a uniform rate. However, doped silicon it has been discovered, as pointed out in the application Ser. No. 171,455, that between certain limits of boron surface concentration in silicon, about $3\times10^{18}$ to $3\times10^{20}$ atoms per cc., the etch rate varies widely. For example, for a concentration of about $3\times10^{18}$ atoms per cc., the etch rate was about 0.95 micron thickness per 1 minute, while for a concentration of about $3\times10^{20}$ atoms of boron per cc. the etch rate was about .02 micron per minute. The latter is to say, that in the area of solid solubility of boron in silicon the etch rate is virtually zero. This phenomenon can be utilized to stop the etching action of KOH solution on silicon, for example, the formation of thin films of silicon of any contour on a supporting substrate. As a practical matter a boron concentration of about $5\times10^{19}$ atoms per cc. or higher is needed, to give a usable difference in etch rate between the silicon substrate and the etch stop.

It is known to use KOH anisotropic etch to form the grooves in single crystal silicon wafers of the <100> crystallographic orientation wherein the KOH anisotropic etch is self-limiting as to the depth of the groove due to the use of a mask. This process utilizing a silicon dioxide mask is shown in the co-pending application of Uryon S. Davidsohn, Ser. No. 158,974 filed July 1, 1971 (a continuation of application Ser. No. 743,251, filed July 8, 1968, now abandoned) entitled "Anisotropic Etching of Monocrystalline Silicon" and assigned to the same assignee as the subject application. In the said application, after the triangular grooves have been etched a layer of silicon dioxide is formed in the grooves and over the adjacent surfaces of the substrate. Thereafter a layer of polycrystalline silicon is formed in the grooves which is of sufficient thickness to provide a supporting structure. Thereafter the original substrate of <100> silicon is removed by polishing techniques or by electrolytic etching until the peaks of the silicon dioxide layer show, whereupon is'ands, or thin films, of single crystal silicon are provided on a substrate. The process thus disclosed is somewhat time consuming, does not result in as great an accuracy as is desired in the finished product, and does not use an etch stopant.

Accordingly, it is a further object of the invention to provide an improved self-limiting etch process, utilizing KOH anisotropic etch to form improved films of silicon of any contour, and a heavily doped boron layer to limit the etching process.

The subject invention utilizes the epitaxial process for forming a thin film, and/or islands, of single crystal silicon doped, or undoped, and is useful in that the thickness of the film, its resistivity and its type may be very accurately controlled.

It is also known to hetero-epitaxially grow single crystal silicon on substrates such as sapphire or spinel. But in these instances there is a certain amount of structural dislocation in the silicon because of the dissimilarity of the crystal structure of the sapphire or spinel substrate and the silicon which is grown hetero-epitaxially thereon. Accordingly, it is a further object of the invention to overcome these deficiencies of the known art and to form epitaxial silicon films dielectrically isolated from a substrate.

It is a further object of the invention to provide a means for stopping the action of KOH anisotropic etch in liquid phase in forming silicon wafers, or wafers having islands of silicon, inasmuch as KOH solution does not appreciably attack or etch silicon with a boron doping level (surface concentration) above $5\times10^{19}$ atoms per cubic centimeter, as a practical matter. The inclusion of a $P^+$ boron doped buried layer with adequate surface concentration can be used as an etch stop in the wafer shaping process. According to the invention, this process is faster, cheaper, simpler and more accurate than mechanical or electrolytic shaping and the process is self-limiting as to etch depth.

It is a further object of the invention to provide an improved method which is easy to use, efficient in operation and economical in performance.

It is a further object of the invention to provide improved devices having reduced mechanical damage in the residual crystal having improved high frequency performance, and having improved parallelism of surfaces.

SUMMARY OF THE INVENTION

In carrying out the invention in one form, there is provided a method of forming a dielectrically isolated film area of silicon semiconductive material mounted on a supporting layer comprising the steps in combination, providing a silicon substrate layer doped to a $P^-$ or $N^-$ level, forming a layer of boron doped silicon on one surface of said substrate, said boron doped layer having a surface concentration of boron atoms equal to at least $5\times10^{19}$ atoms per cubic centimeter, epitaxially forming a film layer of predetermined conductivity type, resistivity and thickness on said boron doped layer, forming an isolation layer over said epitaxially formed layer, forming a supporting layer over said isolation layer, applying a KOH etchant to said substrate layer for etching thereof to said boron doped layer, and removing said boron doped layer.

In carrying out the invention according to another form, the epitaxially formed layer is patterned by a KOH resistant mask prior to applying the KOH etchant, thereby forming islands of epitaxial material.

DESCRIPTION OF THE PREFERRED EMBODIMENTS

Figure 1:
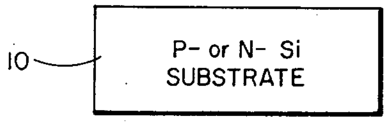
FIG. 1 is a representation on a much enlarged scale of a $P^-$ or $N^-$ silicon substrate.
Figure 2:
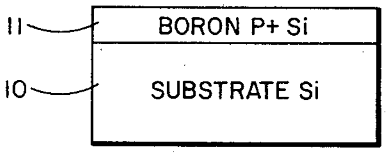
FIG. 2 illustrates the substrate of FIG. 1 after a P+ (boron doped) layer of silicon has been formed thereon.

Referring to FIGS. 1–9 inclusive of the drawing, in one embodiment of the invention, there is shown a substrate layer 10 of single crystal silicon, for example, doped to a P− or N− level. The substrate 10 may, for example, be of the crystallographic orientation <100> and may be of any thickness desired to provide sufficient mechanical support for subsequent handling. In FIG. 2, the substrate 10 is shown with a boron doped layer 11 of silicon formed thereon. The layer 11 may be formed by diffusion techniques or by epitaxial growth, both being well known, the boron concentration preferably being at least $5\times10^{19}$ atoms per cubic centimeter and can be higher, for example, as high as $1\times10^{20}$ or even higher to the level of solid solubility. It is the discovery of the fact that a silicon layer doped with boron to a surface concentration of $5\times10^{19}$ or greater will act as a significant etch stop for the KOH anisotropic etchant that enables the improvements of the subject invention.

Typically the layer 11 may be of about one to one and one-half microns in thickness.

Figure 3:
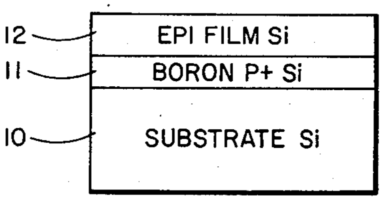
FIG. 3 illustrates the structure of FIG. 2 with an epitaxially formed film of silicon thereon.

In FIG. 3, there is shown formed on the P+ layer 11 an epitaxial film of silicon 12 which may be of any desired thickness, resistivity and type, that is P type or N type as the circumstances may require. The epitaxial film growing technique enables the layer 12 to be very accurately formed as to the desired thickness and concentration of dopant.

Figure 4:
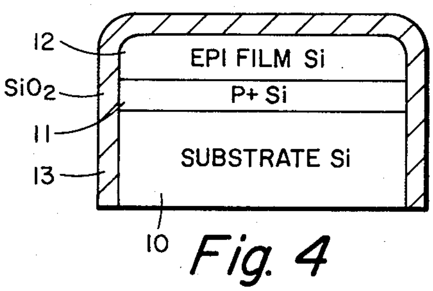
FIG. 4 illustrates the structure of FIG. 3 with a dielectric isolation layer of $SiO_2$ formed upon the structure.

In FIG. 4, the structure of FIG. 3 is shown with a layer of dielectric insulating material 13, for example, silicon dioxide. The latter may be grown or deposited on three sides of the structure as shown.

In subsequent processing it is desired to remove the substrate layer 10 and to facilitate this while preserving the epitaxial film 12, a layer of supporting material, for example, polycrystalline silicon 14 is deposited upon the structure of FIG. 4. The layer 14 is of sufficient thickness to provide support for the film 12 during subsequent processing operations. For protection during subsequent processing, a protective layer 15 of silicon dioxide may be deposited on the outside surface of the polycrystalline silicon supporting layer 14.

Figure 5:
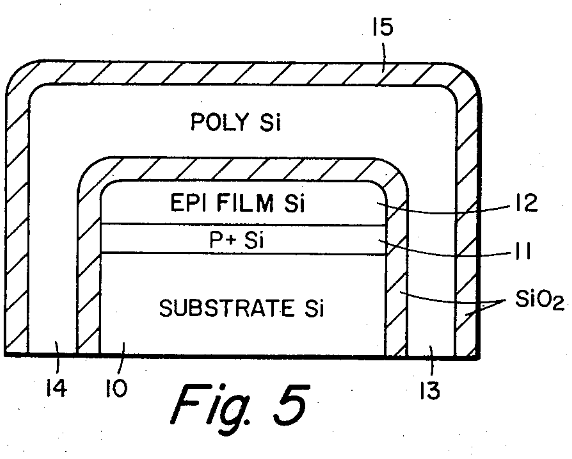
FIG. 5 illustrates the structure of FIG. 4 with a layer of polycrystalline silicon formed thereupon, and a further layer of silicon dioxide formed upon the polycrystalline silicon layer.
Figure 6:
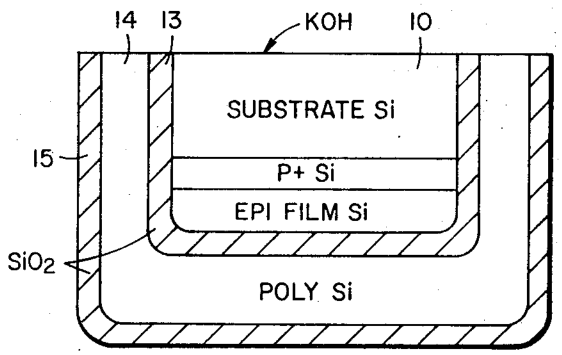
FIG. 6 is the same structure as FIG. 5 but shown in inverted position.

In FIG. 6, the structure of FIG. 5 is identical but is in an inverted position wherein the substrate 10 is uppermost. In this position the KOH anisotropic etching agent is applied to the substrate 10 and it proceeds to etch away the material of the substrate at a rate which is dependent upon the crystallographic orientation of the substrate 10 of silicon. While it has ben indicated that the substrate 10 may be of the <100> crystallographic orientation, it will be clear that silicon of the <110> crystallographic orientation may be used. This etches at a slower rate. Silicon of the <111> crystallographic orientation would probably not be used because of its very slow etching rate with the KOH etching agent.

Figure 7:
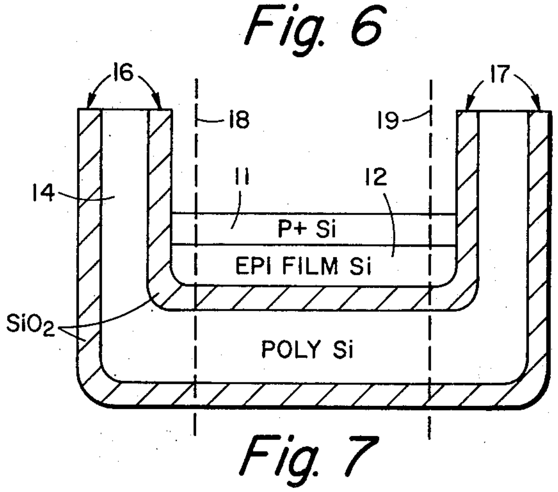
FIG. 7 shows the structure of FIG. 6 with the substrate layer of P− or N− silicon etched away.
Figure 8:
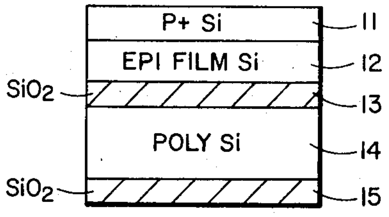
FIG. 8 illustrates the structure of FIG. 7 after the outer layer of silicon dioxide and a portion of the polycrystalline layer has been removed.

FIG. 7 differs from FIG. 6 in that the substrate 10 is completely removed leaving the boron doped layer 11 and the ends 16 and 17. As has been indicated, this layer is doped with boron to a surface concentration of $5\times10^{19}$ atoms per cubic centimeter or greater and thus stops the action of the etchant KOH at the surface of the layer 11. It will be noted that the epitaxial silicon film 12 has been preserved in its original dimensions and characteristics. Referring to FIG. 8, the end portions 16 and 17 of the silicon dioxide layers 13 and 15 and the polycrystalline silicon 14 have been removed as by mechanical shaping to about the dotted lines 18 and 19 (FIG. 7) thereby leaving the structure comprising the P+ layer 11, the epitaxial silicon film 12, a portion of the silicon dioxide layer 13, a portion of the polycrystalline silicon layer 14 and a portion of the silicon dioxide layer 15.

Figure 9:
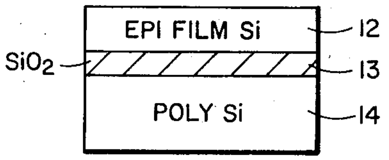
FIG. 9 illustrates the structure of FIG. 8 with the remaining exterior portion of the silicon dioxide layer and the P+ silicon layer also removed.

In FIG. 9, the residual P+ layer 11 has been shown removed as by controlled mechanical polishing or isotropic etching as is well known. Whether controlled mechanical polishing, electrolytic etching or isotropic etching is used, the layer 11 may be accurately removed and the remainder of the silicon dioxide layer 15 at the bottom may, if desired, be removed, leaving the supporting handle or substrate portion 14 of polycrystalline silicon. In the event that the residual P+ layer 11 is removed by isotropic etching, any well known etchant may be used whose etching rate is known in order that the process may be stopped when the P+ layer has been completely removed.

The removal of the residual P+ layer 11 can be very accurately done thus preserving the original dimensions and characteristics of the epitaxial film 11. The thickness of the epitaxial film layer 11 which may, for example, be about 5 microns in thickness, may thus be preserved within an accuracy of about one to one and one-half microns from one edge to the other. In addition the silicon dioxide layer 13 remains in order to dielectrically isolate the epitaxial film 11, the polysilicon layer 14 providing the mechanical support. In other processes, as for example the one referred to in application Ser. No. 743,-251 the accuracy from one side of the wafer to another may be about one-half mil or twelve and one-half microns.

The formulation of the particular mixture of KOH anisotropic etching agent may be any one as is well known to those skilled in the art and would comprise a mixture of KOH, water and alcohol. One formulation that has been utilized comprised 375 grams of KOH, 1200 cubic centimeters of $H_2O$ and 375 grams of isopropyl alcohol, the solution being used at a temperature of about 80° C. Other mixtures will work, especially those using higher boiling temperature alcohol with more water and less KOH, all of which is well known.

For a further embodiment of the invention, reference is made to FIGS. 10–13 inclusive.

Figure 10:
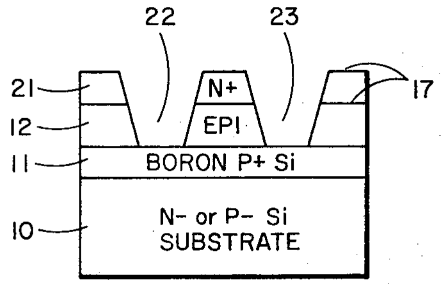
FIG. 10 illustrates the structure of an N+ buried layer dielectric substrate similar to FIG. 3 following certain additional processing steps which, according to a further embodiment of the invention, will produce dielectrically isolated islands.

Referring to FIG. 10, after the epitaxial layer 12 has been formed as described in connection with FIG. 3, there may be deposited on top of the epitaxial layer an N+ layer 21. The doping may be of any of the usual N type dopants as desired and of the desired thickness and surface concentration. Also if desired the layer 21 may be of the P+ variety of any of the usual P dopants of the desired thickness and surface concentration.

After the layer 21 has been formed, the upper surface 17 thereof may be patterned in any well known manner and the KOH anisotropic etch applied to the windows formed in the ensuing mask. The action of the KOH forms the grooves or channels 22 and 23 and continues its action through the N+ layer and the epitaxial layer 12 until the boron P+ layer 11 is reached at which point the action of the KOH anisotropic etch ceases as has already been discussed.

If no N+ layer 21 is used, the epitaxial layer 12 is patterned by well known methods and the KOH etchant applied to form the grooves or channels 22 and 23.

Figure 11:
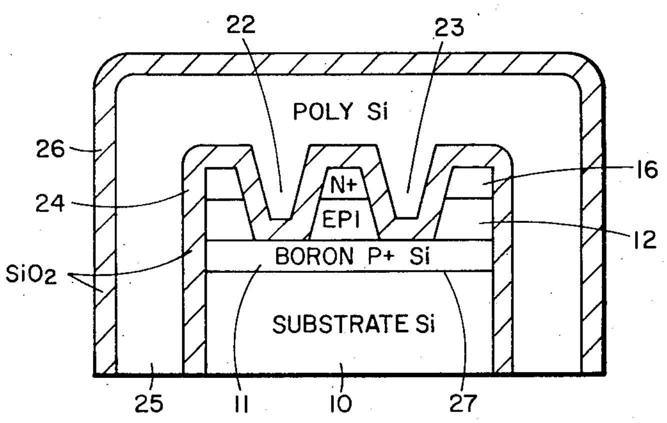
FIG. 11 illustrates the structure of FIG. 10 following additional processing steps necessary to prepare the wafer for etching by anisotropic etch.

Referring to FIG. 11, after the grooves 22 and 23 have been etched, an isolating layer 24 of silicon dioxide is deposited or grown over the structure. The silicon dioxide layer 24 not only surrounds the substrate 10, the P+ layer 11, the epitaxial layer 12 and the N+ layer 21 but it lines the grooves 22 and 23 as well. A substantial layer of supporting material, for example, polycrystalline silicon 25 is then deposited over the silicon dioxide layer 21 in order to form a supporting structure or handle to permit handling of the structure during subsequent processing steps. Over the polycrystalline silicon layer 25 a protective layer of silicon dioxide 26 is deposited.

The substrate 10 is now subjected to the action of the KOH anisotropic etchant which continues its action until the surface 27 of the boron (P+) layer 11 is reached. As described in connection with FIGS. 7 and 8, for similar structures, the portions of the silicon dioxide layers 24 and 25 and the portion of the polycrystalline silicon 25 therebetween may be mechanically removed to give the structure of FIG. 12.

Figure 12:
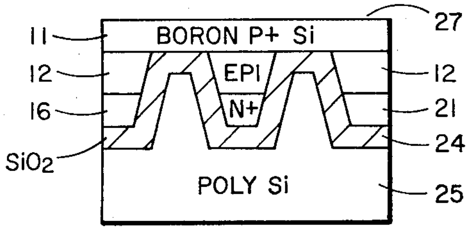
FIG. 12 illustrates the structure of FIG. 11 following KOH anisotropic etching to the P+ etch stop with subsequent removal of unwanted peripheral material.
Figure 13:
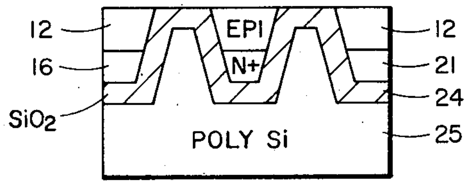
FIG. 13 illustrates the structure of FIG. 12 following still additional processing steps to remove the P+ etch stop to give the final product.

Referring to FIG. 12, the structure has been inverted as compared with the structure in FIG. 11, and the boron layer 11 now appears on top of the structure instead of on the bottom. The remaining portion 25 of the polycrystalline silicon now forms a substrate, in effect and supports the structure for any subsequent operation. The structure as shown in FIG. 12 now has the boron layer 11 (surface 27) subjected to mechanical polishing, electrolytic or other well known isotropic etch techniques which will remove the boron layer 11 to give the structure as shown in FIG. 13. From FIG. 13 it will be apparent that the epitaxial layer 12 now consists of a series of islands which are dielectrically isolated by the $SiO_2$ layer portions 24 at the bottom of the grooves of which are the remnants of the N+ layer 21.

The isotropic etches for removing the boron layer 11 have well known etch rates and therefore can remove this layer accurately without changing, in any substantial way, the dimensions of the epitaxial islands 12. Thus in the form of the invention shown in FIGS. 10–13, the boron layer 11 acts as an etch stoppant when etching from both directions at different times, once to form the epitaxial islands and the other to remove the original substrate. The dimensional accuracy of the epitaxial layer 12 and the remnant islands remains the same within the tolerances previously disclosed, namely one to one and one-half microns.

It will be evident that the technique described will allow much tighter thickness control than is produced by mechanical shaping or electrolytic etching alone. Crystal quality is better and the carrier mobilities will be higher than available in heteroepitaxial silicon formed on sapphire or spinel. The interface problem that exists as between silicon on spinel or sapphire is greatly reduced. Yield is improved, the necessity for rigid planarizing and paralleling of both surfaces during processing is reduced. Mechanical damage in the residual crystal is reduced resulting in improved high frequency device preformance.

The structure described has usefulness in the fabrication of devices such as junction field effect transistors, MOS field effect transistors in that it reduces the back or bottom gate capacitance for high frequency performance. In addition, improvements are achieved in the collector substrate parasitics as well as in the reduction of $R_{SAT}$. Yield is improved not only in the case of the structure described in FIGS. 10–13 but also in the structure described in FIGS. 1–9.

The substrate 10 while specifically described as being doped, for example, to a P− or N− lead, may be doped to any level so long as it is less than $5\times10^{19}$ atoms per cc. of boron.

What is claimed is:

1. The method of forming a dielectrically isolated film area of silicon semiconductive material mounted on a supporting layer comprising the steps in combination:
- providing a single crystal silicon substrate layer having a crystallographic orientation selected from <100> and <110> orientations, and having either P or N doping of any level except P doping, if boron, must be of a level less than $5\times10^{19}$ atoms per cc.;
- forming a layer of boron doped silicon on one surface of said substrate;
- said boron doped layer having a concentration level of boron atoms equal to at least $5\times10^{19}$ atoms per cc.;
- epitaxially forming on said boron doped layer, a film layer of either P or N doping of any level except P doping, if boron, must be of a level less than $5\times10^{19}$ atoms per cc.;
- forming an isolation layer over said epitaxially formed layer;
- forming a supporting layer over said isolation layer;
- applying a KOH etchant to said substrate layer for etching thereof to said boron doped layer; and
- removing said boron doped layer.

2. The method according to claim 1 wherein:
- a layer of N+ or P+ doped silicon is formed on said epitaxially formed layer.

3. The method according to claim 1 wherein:
- said supporting layer comprises polycrystalline silicon.

4. The method according to claim 3 including the step of depositing over said layer of polycrystalline silicon a protective layer.

5. The method according to claim 4 wherein said protective layer and a portion of said isolating layer are removed mechanically.

6. The method according to claim 4 wherein said protective layer and a portion of said isolating layer are removed by an isotropic etch.

7. The method of forming a dielectrically isolated film area of silicon semiconductive material mounted on a supporting layer comprising the steps in combination:
- providing a single crystal silicon substrate layer having a crystallographic orientation selected from <100> and <110> orientations, and having either P or N doping of any level except P doping, if boron, must be of a level less than $5\times10^{19}$ atoms per cc.;
- forming a layer of boron doped silicon on one surface of said substrate;
- said boron doped layer having a concentration level of boron atoms equal to at least $5\times10^{19}$ atoms per cc.;
- epitaxially forming, on said boron doped layer, a film layer of either P or N doping of any level except P doping, if boron, must be of a level less than $5\times10^{19}$ atoms per cc.;
- patterning said epitaxially formed layer with a KOH resistant mask of any pattern;
- applying a KOH etchant to said patterned epitaxial layer for etching thereof to said boron doped layer to form islands of epitaxial material;
- forming an isolation layer over said islands of epitaxial material;

forming a supporting layer over said isolation layer;
applying a KOH etchant to said substrate layer for etching thereof to said boron doped layer;
and removing said boron doped layer.

8. The method according to claim 7 wherein: a layer of $N^+$ or $P^+$ doped silicon is formed on said epitaxially formed layer.

9. The method according to claim 8 wherein the epitaxially formed layer and the $N^+$ or $P^+$ doped silicon layer thereon are patterned by a KOH resistant mask prior to applying the KOH etchant, thereby forming islands of epitaxial material topped by layers of $P^+$ or $N^+$ doped silicon.

10. The method according to claim 7 wherein: said supporting layer comprises polycrystalline silicon.

11. The method according to claim 10 including the step of depositing over said layer of polycrystalline silicon a protective layer.

12. The method according to claim 11 wherein: said protective layer and a portion of said isolating layer are removed mechanically.

13. The method according to claim 11 wherein: said protective layer and a portion of said isolating layer are removed by an isotropic etch.

References Cited

UNITED STATES PATENTS

| | | | |
|---|---|---|---|
| 3,171,762 | 3/1965 | Rutz | 148—175 |
| 3,418,226 | 12/1968 | Marinace | 204—143 |
| 3,429,756 | 2/1969 | Groves | 156—17 |
| 3,471,922 | 10/1969 | Legat et al. | 29—580 |
| 3,623,218 | 11/1971 | Mitarai et al. | 156—17 X |

OTHER REFERENCES

Finne et al. "Water-Amine-Complexing Agent . . . Etching Silicon," J. Electrochem. Soc.: Solid State Science, vol. 114, No. 9, September 1967, pp. 965–970.

Uhlir, A. "Electrolytic Shaping of Germanium and Silicon," Bell System Tech. Journal, March 1956, pp. 333–347.

CHARLES N. LOVELL, Primary Examiner

W. G. SABA, Assistant Examiner

U.S. Cl. X.R.

29—580; 117—201, 212; 148—174; 156—17; 317—235 R